(12) United States Patent
Nangia et al.

(10) Patent No.: US 12,293,948 B2
(45) Date of Patent: May 6, 2025

(54) FLIP CHIP SEMICONDUCTOR DEVICE PACKAGE WITH MOLD COMPOUND SEAL

(71) Applicant: Texas Instruments Incorporated, Dallas, TX (US)

(72) Inventors: Amit Sureshkumar Nangia, Murphy, TX (US); Gregory Thomas Ostrowicki, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 608 days.

(21) Appl. No.: 17/487,318

(22) Filed: Sep. 28, 2021

(65) Prior Publication Data
US 2023/0102688 A1    Mar. 30, 2023

(51) Int. Cl.
*H01L 23/10*     (2006.01)
*H01L 21/67*     (2006.01)
*H01L 23/06*     (2006.01)
*H03H 9/02*      (2006.01)

(52) U.S. Cl.
CPC ........ *H01L 23/10* (2013.01); *H01L 21/67126* (2013.01); *H01L 23/06* (2013.01); *H03H 9/02007* (2013.01)

(58) Field of Classification Search
CPC ... H01L 23/10; H01L 21/67126; H01L 23/06; H01L 23/3157; H01L 23/562; H01L 24/13; H01L 24/16; H01L 24/81; H01L 23/3121; H01L 23/315; H03H 9/02007; H03H 9/1014
USPC .......................................................... 257/678
See application file for complete search history.

(56) References Cited

U.S. PATENT DOCUMENTS

2013/0249109 A1*    9/2013   Ma ...................... B81C 1/00238
                                                         257/774

FOREIGN PATENT DOCUMENTS

KR         20100119858 A  * 11/2010   ............. H01L 24/06

OTHER PUBLICATIONS

In-Situ Cavity Integrated Circuit Package 2010.*
Dimaano et. al., "New Generation Routable QFN for Power SiP Applications," Minapad 2018, May 16-17, 2018, Grenoble, France; accessed Sep. 28, 2021, https://www.semiconductorpackagingnews.com/uploads/1/New_Generation_Routable_QFN_for_Power_SiP_Applications_SPN.pdf#:~:text=Routable%20leadframe%20technologies%20%28such%20as%20GQFN%29%20are%20becoming,support%20for%20large%20inductors%20and%20other%20passive%20components.

* cited by examiner

*Primary Examiner* — Jasmine J Clark
(74) *Attorney, Agent, or Firm* — Xiaotun Qiu; Frank D. Cimino

(57) ABSTRACT

In a described example, an apparatus includes: a semiconductor die with a component on a device side surface; a die seal surrounding the component on the device side surface; a package substrate having bond pads on a die side surface; a package substrate seal formed on the die side surface of the package substrate corresponding to the die seal on the semiconductor die; the semiconductor die flip chip mounted on the bond pads of the package substrate with solder joints connecting post connects on the semiconductor die to the bond pads of the package substrate; a mold compound seal formed by the die seal and the package substrate seal; and mold compound covering a portion of the semiconductor die, a portion of the die side of the package substrate, and contacting the mold compound seal, the mold compound spaced from the component.

23 Claims, 14 Drawing Sheets

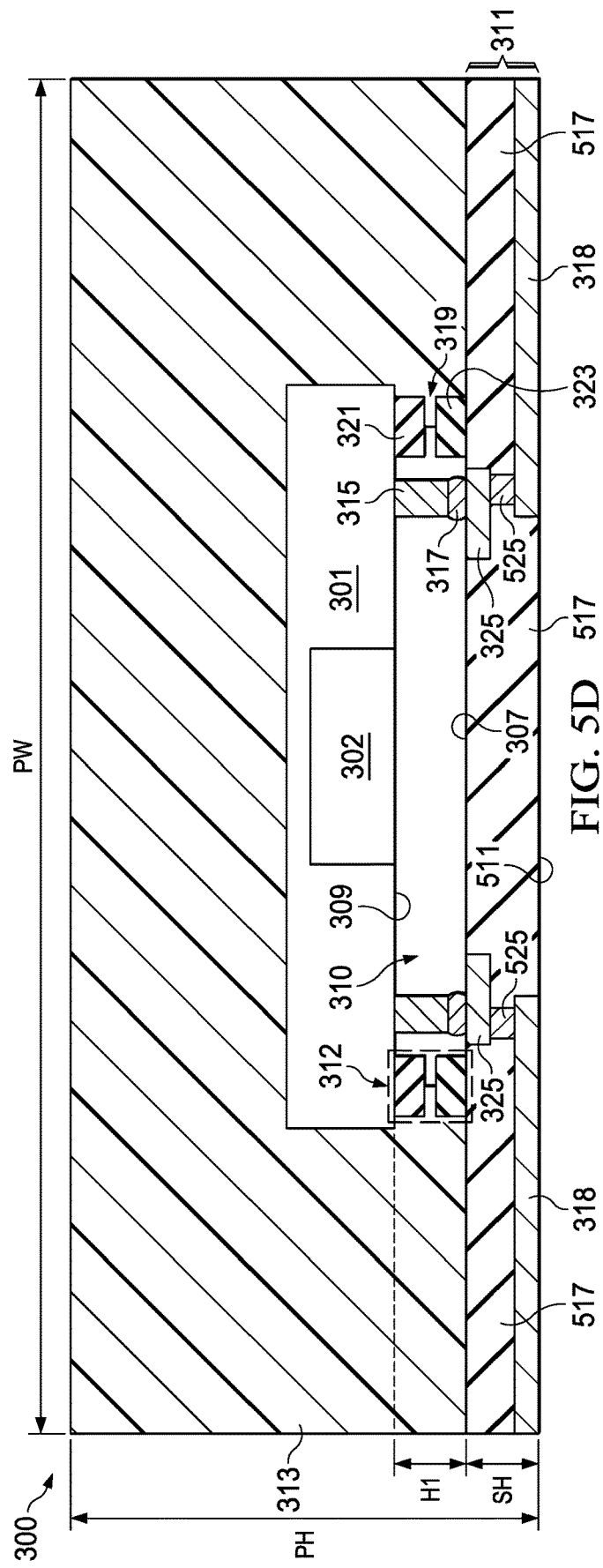

FLIP CHIP SEMICONDUCTOR DEVICE PACKAGE WITH MOLD COMPOUND SEAL

TECHNICAL FIELD

This relates generally to semiconductor device packaging, and more particularly to a semiconductor device package for a semiconductor die with a stress sensitive component.

BACKGROUND

Stress sensitive components have electrical characteristics that are adversely affected by mechanical stress. Examples include precision reference circuits, diodes, filters, sensors, resonators, analog-to-digital converters (ADCs), resistors, capacitors, inductors and coils. In one example a bulk acoustic wave (BAW) device used as a resonator is a stress sensitive component. The stress sensitive component can be formed on a semiconductor die; alternatively, a stress sensitive component can be formed on a first semiconductor die that is placed in proximity to a second semiconductor die. The second semiconductor die can be a driver die or controller die that is coupled with the first semiconductor die including the stress sensitive component to form a circuit. In an example with a single semiconductor die including a stress sensitive component, the device is packaged, for example by mounting the semiconductor die to a package substrate and then encapsulating the semiconductor die in a dielectric material such as a mold compound. In an example with two dies, the first semiconductor die and the second semiconductor die can be packaged together, for example by mounting the two dies to a package substrate and then encapsulating the two semiconductor dies and portions of the package substrate in mold compound.

Mold compound is an epoxy resin composition. The mold compound can be filled with particles such as silica or aluminum oxide particles. Filler can comprise over 90% of the mold compound by weight. The mold compound is either a liquid at room temperature or a solid at room temperature. If a solid, it can be heated to a liquid state before being used in molding. The liquid mold compound is injected or otherwise transferred into a mold containing the package substrate and the semiconductor die. After the mold compound cools, the packaged semiconductor device is removed from the mold. During curing and cooling the mold compound shrinks and applies unwanted compressive and/or shear stress to the dies and to the stress sensitive component in the packaged device. Mold compounds can have curing stresses in the range of twenty to several hundred mega (million) pascals (MPa). Mold compound curing stress and thermal expansion mismatch can induce stress on the semiconductor die in the range of ten to several hundred Mpa. Stress on the semiconductor die and the stress sensitive component can be amplified when concentrated by points on filler particles within the mold compound that are pressing against the semiconductor die or the stress sensitive component. Larger filler particles concentrate more stress and apply more pressure against the devices.

The stress sensitive component may have electrical properties that are adversely changed by compressive and/or tensile stress. Distribution of larger filler particle sizes in mold compound can concentrate more stress and apply more localized pressure against the devise. Devices produced in the same packaging process may have different localized stress effects, resulting in non-uniform performance of like packaged devices across completed units in a single lot, or similarly across different lots of the packaged semiconductor devices.

SUMMARY

In a described example, an apparatus includes: a semiconductor die with a component on a device side surface; a die seal surrounding the component on the device side surface; and a package substrate having bond pads on a die side surface. A package substrate seal is formed on the die side surface of the package substrate corresponding to the die seal on the semiconductor die. The semiconductor die is flip chip mounted on the bond pads of the package substrate with solder joints connecting post connects on the semiconductor die to the bond pads of the package substrate. A mold compound seal is formed by the die seal and the package substrate seal. Mold compound is formed covering a portion of the semiconductor die, a portion of the die side of the package substrate, and contacting the mold compound seal, the mold compound is spaced from the component.

BRIEF DESCRIPTION OF THE DRAWINGS

FIGS. 5A-5D illustrate in a series of cross sectional views steps for forming a package of an arrangement.

DETAILED DESCRIPTION

Figure 1:
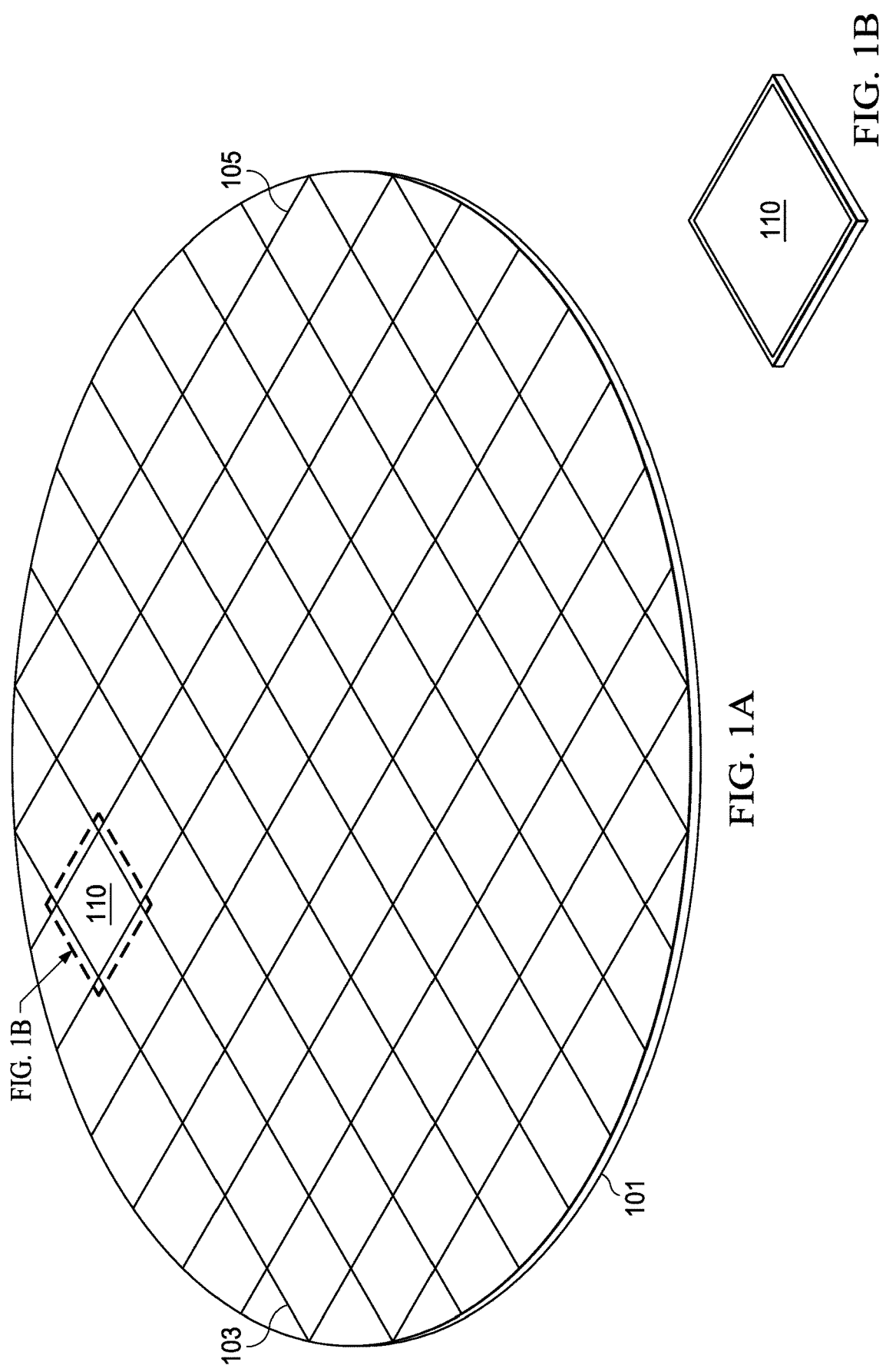
FIGS. 1A-1B illustrate in projection views a semiconductor wafer with device dies and a unit semiconductor die, respectively.

Corresponding numerals and symbols in the different figures generally refer to corresponding parts unless otherwise indicated. The figures are not necessarily drawn to scale.

In the arrangements, unwanted mechanical stress on a stress sensitive component is reduced or eliminated by flip-chip mounting a semiconductor die including the stress sensitive component. The semiconductor die is mounted onto a die side surface of a package substrate. A die seal formed on a device side surface of the semiconductor die is arranged to meet a package substrate seal formed on the package substrate, the die seal and the package substrate seal meet to form a mold compound seal extending around the stress-sensitive component. When the semiconductor die and the package substrate are subsequently encapsulated with mold compound, the mold compound seal prevents the mold compound from coming into contact with the stress sensitive component. In some arrangements, a cavity is formed by the mold compound seal, the device side surface of the semiconductor die, and the die side surface of the package substrate, with air in the cavity, so that air within the cavity is in contact with the portion of the semiconductor die that includes the stress sensitive component, and the mold compound is spaced from and not in contact with the stress sensitive component. Assembly can be done by mounting semiconductor dies to a package substrate that includes unit package substrate devices in an array of rows and columns. For each of the unit package substrate devices, the mold compound seal spaces the stress sensitive component from the mold compound, reducing mechanical stress and reducing or eliminating adverse changes in device characteristics of the stress sensitive component due to mold compound stress. Use of the arrangements results in reducing or eliminating adverse changes in component performance characteristics due to mechanical stress when compared to devices packaged without use of the arrangements.

The term "package substrate" is used herein. A package substrate is a support having a surface suitable for mounting a semiconductor device. In the arrangements, useful package substrates can include: routable lead frame (RLF) substrates including conductors and dielectrics in a substrate, molded interconnect substrates (MIS); pre-molded lead frames (PMLFs) with lead frame conductors and dielectric material in a preformed structure; tape based and film-based substrates carrying conductors; laminate substrates with multiple layers of conductors and insulator layers; and printed circuit board substrates of ceramic, plastic, fiberglass or resin, such as flame retardant 4 (FR4) substrates. Lead frames that are "half-etched" or "partially etched" to form portions of different thicknesses, or to form openings in metal layers, can be used. In the example arrangements, a routable lead frame package substrate has a die side surface and an opposing board side surface. Traces on the board side surface of the routable lead frame form terminals for a packaged semiconductor device, and a semiconductor die is flip chip mounted on the die side surface of the routable lead frame. Bond pads on the die side surface are used to solder post connects on the semiconductor die to the routable lead frame.

The term "post connect" is used herein. As used herein, a post connect is a structure made of a conductive material, for example copper or copper alloys, gold or gold alloys, or combinations of conductive metal that provides a connection between a semiconductor die and a package substrate. A proximate end of the post connect is mounted to a bond pad on a device side surface of a semiconductor die, while a distal end of the post connect is extended away from the bond pad of the semiconductor die. When the semiconductor die is mounted to a package substrate, the semiconductor die is oriented with the semiconductor die positioned above and facing a die mount surface of a package substrate in a flip-chip orientation, the post connect makes a vertical connection between a conductive portion of the package substrate and the bond pad of the semiconductor die. Some references describe a type of post connect as a "controlled collapse chip connection" or as "C4" bumps. The conductive post connect includes a post of conductor material and a solder bump or ball at the distal end facing away from the surface of the bond pad on the semiconductor die, where a proximal end of the post connect is mounted to the bond pad. The conductive material remains intact after the solder bump is melted during a solder reflow process, the conductive material controlling the vertical spacing, or controlling the "collapse" of the post connect structure during a solder reflow process.

The term "mold compound seal" is used herein. A mold compound seal is a structure that prevents mold compound from flowing to an area during a molding process. In the arrangements a mold compound seal is formed between a flip chip mounted semiconductor die and a die side surface of a package substrate. The term "die seal" is used herein. A die seal is a seal structure formed on a device side surface of a semiconductor die. In the arrangements a die seal is a dielectric material that has a thickness extending above a device side surface of a semiconductor die. The die seal may be a continuous ring of dielectric material surrounding an area on the device side surface of a semiconductor die. Alternatively, the die seal can be formed of segments of dielectric material placed to form the die seal and to prevent mold compound from flowing between the segments. Example dielectric materials useful in the arrangements include polyimide (sometimes referred to as "PI") and benzocyclobutene (BCB). The term "package substrate seal" is used herein. A package substrate seal is a seal structure formed on the die side surface of a package substrate, and having a thickness above the die side surface of the package substrate. In the arrangements a package substrate seal is formed by plating a conductor, including for example copper, gold, nickel, or alloys thereof, onto the die side surface of the package substrate. The package substrate seal is arranged to correspond to the die seal of a semiconductor die. In an example the package substrate seal is a continuous ring of a conductor material, alternatively, the package substrate seal can be formed of segments that are placed so mold compound cannot flow between the segments. In the arrangements, a mold compound seal between a flip chip mounted semiconductor die and the die side surface of a package substrate is formed by placing a die seal and a package substrate seal together when the semiconductor die is mounted to the package substrate. In example arrangements, a slight gap of less than 25 microns can be formed between the die seal and the package substrate seal when the two surfaces are brought together. Alternatively, the die seal and the package substrate seal may be in physical contact with no gap between them.

FIGS. 1A-1B illustrate, in projection views, a semiconductor wafer and a semiconductor die. In FIG. 1A, a semiconductor wafer includes semiconductor dies 110 in an array of rows and columns of identical dies. The dies 110 can be integrated circuits, such as an integrated circuit driver device. The dies 110 can be a component, such as a passive component, a sensor, a bulk acoustic wave (BAW) device, a resistor, capacitor, inductor or coil. The dies 110 can include a stress sensitive component that has electrical characteristics that change undesirably when exposed to mechanical stress.

Wafer 101 has scribe lines 103 arranged in a first direction and scribe lines 105 arranged in a second direction that is normal to the first direction. When fabrication of the semiconductor dies 110 is complete, the semiconductor dies 110 are singulated from the wafer 101 using wafer dicing tools such as a dicing saw, or using laser cutting tools to cut along the scribe lines. FIG. 1B illustrates in a projection view one semiconductor die 110 that has been removed from wafer 101.

Figure 2:
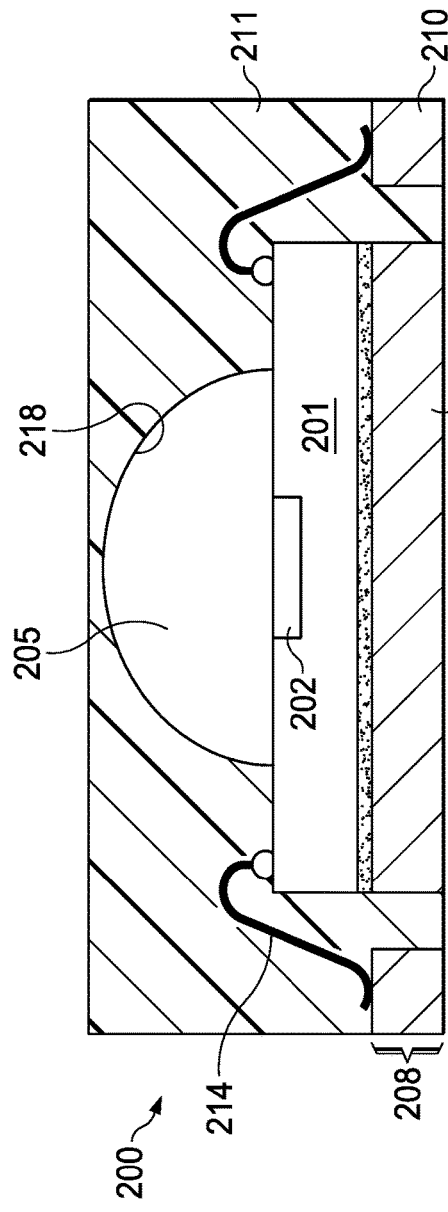
FIG. 2 illustrates in a cross sectional view a semiconductor device package including a semiconductor die with a stress sensitive component.

FIG. 2 illustrates, in a cross sectional view, a packaged semiconductor device 200 including a stress sensitive component 202 on device side surface of a semiconductor die 201. Package 200 is a no lead semiconductor package, referred to as a no lead package because terminals 210, part of a package substrate 208, do not extend beyond the periphery of a package body formed by a mold compound 211. In the example of FIG. 2 the stress sensitive component 202 can be a BAW device formed in semiconductor die 201.

Other components can be formed that are also stress sensitive components. In FIG. 2, the stress sensitive component 202 is formed on semiconductor die 201 with an a device side surface of the semiconductor die 201 facing away from the package substrate 208, or "face up."

A low modulus silicone material covers the stress sensitive component 202, this domed shaped material is sometimes referred to as "glob top" material. During the molding process, glob top 205 forms a filled cavity 218 in mold compound 211, preventing mold compound 211 from contacting the stress sensitive component 202 and from placing mechanical stress on the stress sensitive component 202. Bond wires 214 electrically couple the semiconductor die 201 to leads 210 on the package substrate 208. In this example, the package substrate is a metal lead frame. In another example, ribbon bonds can be used to electrically connect the leads 210 to the semiconductor die 201. A die pad 216 supports the semiconductor die 201. The example package 200 is a quad flat no lead (QFN) package. QFN packages have terminals on four sides formed of portions of the package substrate leads that are exposed from the mold compound, the terminals are coextensive with the package body, so that QFN packages take less board area when mounted (compared to the area of a corresponding leaded semiconductor device package). QFN packages are increasingly used, in part because of the efficient use of board area. Other no lead packages such as small outline no lead packages can be used.

As die sizes and semiconductor package sizes continue to fall with further advances in semiconductor processes, it is desirable to shrink the packages for the semiconductor die including the stress sensitive component. It is also desirable to reduce costs, for example by eliminating materials. The use of the glob top 205 to form the cavity 218 in FIG. 2 requires the semiconductor die 201 to be of a sufficient area to allow for a required spacing distance between the ball bonds for wire bonds 214 and the glob top 205. Further, the glob top 205 is also required for the package 200, which requires an additional material and adds costs.

In the arrangements, a semiconductor device package for a semiconductor die including a stress sensitive component uses flip chip mounting. A mold compound seal is formed between the semiconductor die and a package substrate. In some example arrangements, the mold compound seal, the device side surface of the semiconductor die, and a die side surface of the package substrate, bound a cavity with the stress sensitive component disposed within the cavity. In an example arrangement, the mold compound seal is formed from a die seal of dielectric material on the device side surface of the semiconductor die and a package substrate seal formed of conductor material on a die side surface of a package substrate. The die seal and the package substrate seal meet and form a hybrid mold compound seal of two different materials surrounding the stress sensitive component. When the devices are then encapsulated with mold compound in a molding process, the mold compound seal formed by the two structures prevents the mold compound from contacting the stress sensitive component. In some example arrangements a cavity filled with air is formed, and the mold compound is prevented from entering the cavity. After the mold compound cures, the mold compound is spaced from the stress sensitive component, preventing mechanical stress due to the mold compound from affecting the stress sensitive component.

Figure 3:
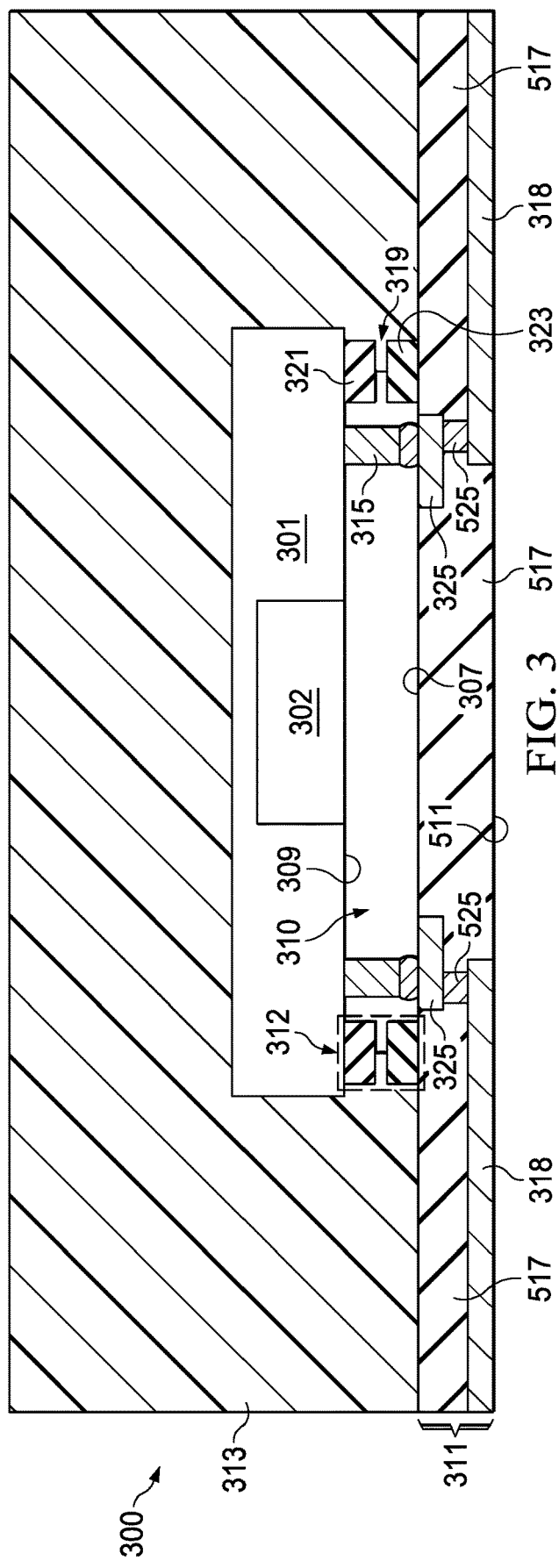
FIG. 3 illustrates in a cross sectional view an arrangement for a semiconductor device package with a semiconductor die including a stress sensitive component.

FIG. 3 illustrates, in a cross sectional view, a package 300 of an arrangement. In FIG. 3, a first semiconductor die 301 includes a stress sensitive component 302 on a device side surface 309 of the semiconductor die 301. Semiconductor die 301 is flip chip mounted to a package substrate 311. Post connects 315 extend from the semiconductor die 301 and are connected to conductive bond pads 325 on a die side surface 307 of package substrate 311 by solder bumps on the ends of the conductive post connects 315. In an example post connects 315 can be copper pillar bumps. A cavity 310 is bounded by the mold compound seal 312, which forms the vertical sides of the cavity, the device side surface of the semiconductor die 301 (which forms the top of the cavity 310) and the die side surface 307 of package substrate 311 (which forms the bottom of the cavity 310), in this example, the package substrate 311 is a routable lead frame. The cavity 310 is sealed on four vertical sides by mold compound seal 312. Mold compound seal 312 includes die seal 321 which is formed over the device side surface 309 of the semiconductor die 301, and a package substrate seal 323, which is formed on the die side surface 307 of the package substrate 311. Mold compound 313 covers portions of the package substrate 311, portions of the semiconductor die 301, and contacts portions of the mold compound seal 312. The mold compound seal 312 is arranged to space the mold compound 313 from the stress sensitive component 302. The die seal 321 and the package substrate seal 323 are formed in alignment with one another and are arranged to meet one another to form the mold compound seal 312, which surrounds the cavity 310 on all sides. The die seal 321, which can be formed of a polyimide material, and the package substrate seal 323, which can be formed of a plated layer such as a plated conductor material, are arranged to meet one another, but in useful examples a slight gap 319 of less than 25 microns can exist between the die seal 321 and the package substrate seal 323. In useful examples the gap 319 can be between no gap, or zero thickness, and up to a maximum gap thickness of 15-25 microns, depending on the mold compound selected. Mold compound 313 covers portions of the semiconductor die 301, portions of the die side surface of the package substrate 311, and contacts the mold compound seal 312. The mold compound seal 312 prevents the mold compound 313 from contacting the stress sensitive component 302 during an encapsulation molding process. The package substrate 311 has terminals 318 on a board side surface opposite the die side surface 307. Terminals 318 provide electrical connections and mechanical mounting structures for the package 300. Package 300 is a no lead package, such as a QFN package. Other package types including leaded and no lead packages can be used.

Use of the arrangements of FIG. 3 separates the mold compound 313 from a stress sensitive component 302 on semiconductor die 301 without the need for additional materials. By spacing the mold compound 313 from the stress sensitive component 302, mechanical stress from the mold compound 313 does not undesirably affect the stress sensitive component 302. The features of the arrangements are scalable, so that as the size of semiconductor die 301 continuously shrinks with technology advances, the size of the overall package 300 can also shrink, the features used to provide the mold compound seal 312 can scale with the size of the semiconductor die 301. Use of the arrangements requires no change in existing materials, uses existing semiconductor packaging processes, and are efficient and economical to implement. No low modulus material is needed within the package 300. Note that while in the illustrated examples a single semiconductor die is shown being assembled and flip chip mounted to a unit package substrate, in a production example the package substrate 311 can include a strip or array of unit devices, for example a package substrate panel can have tens, hundreds or more unit package substrate devices in rows and columns. For each unit device on the package substrate panel, a semiconductor die can be flip chip mounted contemporaneously, a solder reflow process can form the solder joints to mount the semiconductor dies to the package substrates and to complete the electrical connections, and a block molding operation can complete the multiple unit devices simultaneously. The molded devices are then separated into packaged semiconductor devices in a singulation operation using a mechanical saw, for example, to cut the devices apart.

Figure 4A:
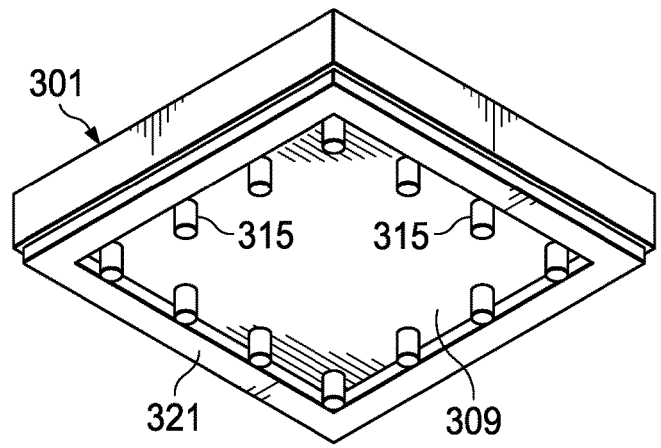
FIGS. 4A-4C illustrate in projection views selected steps for forming a package for use in the arrangements.
Figure 4B:
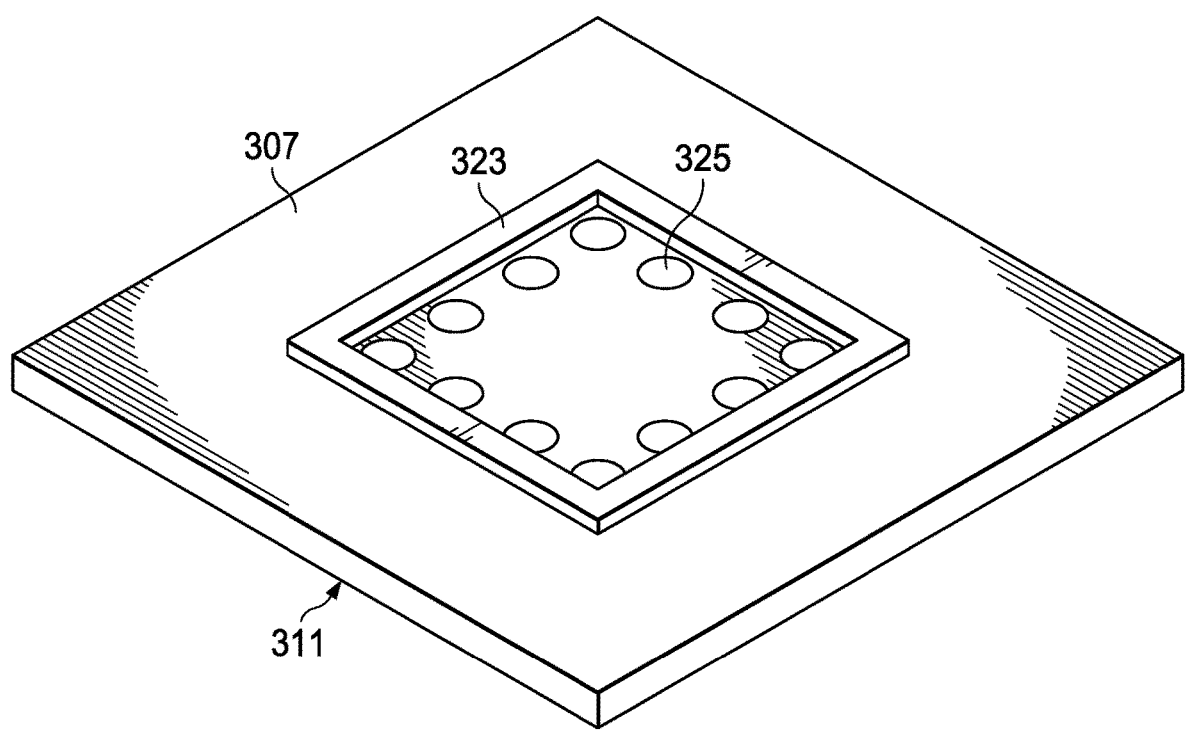
Figure 4C:
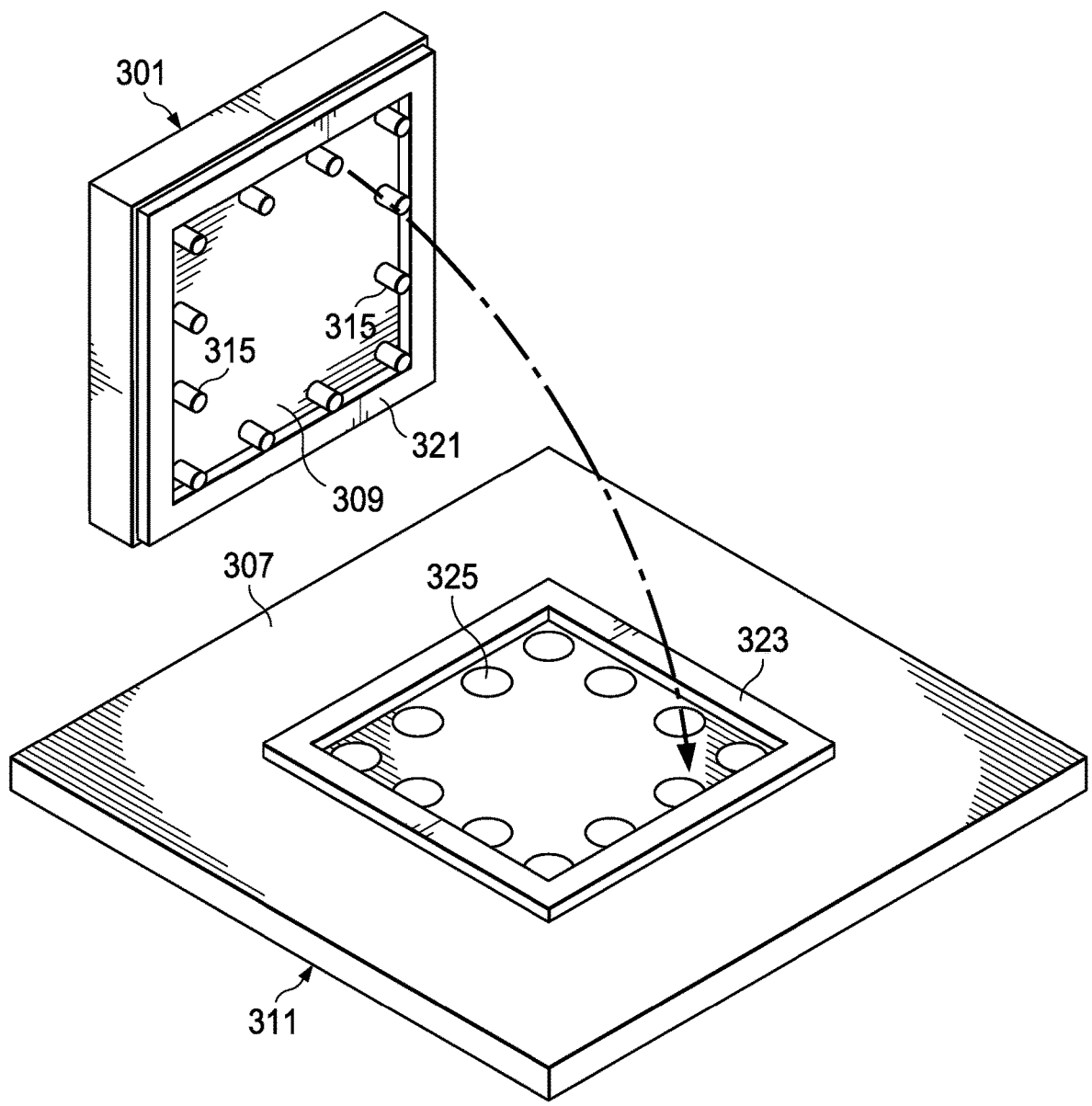

FIGS. 4A-4C illustrate, in projection views, certain features of the arrangements. FIG. 4A illustrates a semiconductor die 301 in a projection view. Post connects 315 extend from the device side surface 309 of the semiconductor die 301. Die seal 321 is formed of a dielectric material that extends from the device side surface 309 of the semiconductor die 301. In an example, the die seal 321 is formed from polyimide, which is often used to cover the device side surface of a semiconductor die, and is sometimes referred to as a passivation layer or PI layer. Organic films can be used for die seal 321 such as benzocyclobutene (BCB). The die seal 321 can be patterned using photoresist and wet etch, plasma dry etch, or direct patterning. Reactive ion etching (RIE) can be used. The die seal 321 has a thickness that is less than the length of the conductive post connects 315. In the illustrated example, the die seal 321 forms a continuous ring around the post connects 315 and a portion of the semiconductor die device side surface 309, including a stress sensitive component (not shown, see FIG. 3, 302). In an alternative approach, the die seal 321 can be formed of segments, for example four segments, one for each of four sides of the ring, and the segments can be placed with ends adjacent and spaced so that mold compound cannot flow between the segments. Post connects 315 can be copper pillars, and when the distal end is covered with a solder pillar or solder bump, can be copper pillar bumps. The post connects 315 can be formed using electroless and electroplating processes. In one example bump process, a seed layer can be sputtered over a wafer surface. Photoresist can be deposited over the seed layer and patterned to expose positions for the conductive post connects. Using the seed layer, plating can be performed, for example copper electroplating, to form the conductive post connects. Solder can be plated onto the end of the conductive post connects. The photoresist can be removed, and the unneeded seed layer can be removed, leaving an array of conductive post connects 315 extending from the device side surface 309 of the semiconductor die 301. Other conductors that can be formed using plating can be used, for example gold. Additional plating layers such as nickel, gold, tin, palladium and combinations of these can be used to increase solderability or reduce corrosion and ion diffusion effects.

FIG. 4B illustrates a package substrate 311 for use with the arrangements. In an example the package substrate 311 is a routable lead frame. The package substrate 311 includes dielectric material, such as mold compound, and conductor layers spaced from one another by the dielectric material and connected vertically by conductive vias. In the illustrated examples, a three layer routable lead frame is shown, however routable lead frames useful in the arrangements can include more or fewer conductor layers and more or fewer via layers connecting the conductor layers through the dielectric material. In FIG. 4B, the die side surface 307 of the package substrate 311 has bond pads 325 that are exposed from the dielectric material of the package substrate 311. The bond pads 325 can be coplanar with the die side surface 309, so that the exposed surface of the bond pads 325 do not extend above the die side surface 307. The bond pads 325 are arranged and sized to provide a connection with a corresponding one of the post connects 315 (see FIG. 4A) and are configured for making a solder joint connection to the conductive post connects. Package substrate seal 323 is also shown on the die side surface 309 of the package substrate 311. The package substrate seal is deposited on the die side surface 309 of the package substrate 311, and extends from the die side surface 309. The package substrate seal 323 is arranged to meet and correspond to the die seal 321 (see FIG. 4A). The package substrate seal 323 can be formed, for example, using electroplating or electroless plating of copper, gold, nickel or another metal plated over the die side surface 309 of the routable lead frame.

FIG. 4C illustrates, in a projection view, the semiconductor die 301 of FIG. 4A, with the post connects 315 and the die seal 321 aligned with and being moved to flip chip assemble the semiconductor die 301 to the package substrate 311 of FIG. 4B, with the package substrate seal 323 arranged to meet the die seal 321 to form a continuous mold compound seal, and with bond pads 325 arranged for a solder reflow process to form solder joints with the conductive post connects 315. As shown in FIG. 4C, the semiconductor die 301 will be placed so that the conductive post connects 315 contact the bond pads 325, and a thermal solder reflow process will be used to from solder joints between solder bumps on the ends of post connects 315 and the bond pads 325 on the package substrate 311.

Figure 5A:
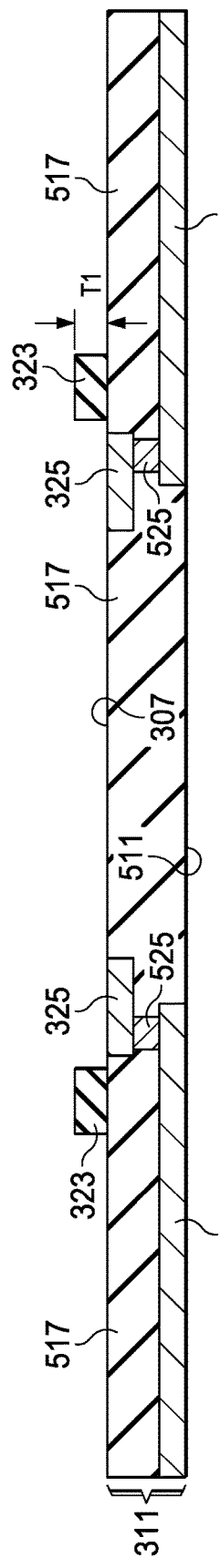

FIGS. 5A-5D illustrate, in a series of cross sections, selected steps of a process for forming a semiconductor device package of the arrangements. In FIG. 5A, a package substrate 311, which in the illustrated example is a routable lead frame, is shown in a cross sectional view. The example package substrate 311 has three conductor layers, with a board side surface 511 having traces that form terminals 318 in a first layer, conductive vias 525 in a second layer, and bond pads 325 in a third layer, the conductor layers spaced by dielectric material 517, which can be a mold compound. Package substrate seal 323 is shown formed on the die side surface 307 of the package substrate 311. The package substrate seal 323 can be formed by electroplating or by electroless plating of a metal, such as copper, gold, nickel, or an alloy of these, on the die side surface 307 of the package substrate 311. The package substrate seal 323 can have a thickness T1 of about 0.035 millimeters, for example. Thickness T1 can range from 0.005 to 0.07 millimeters, depending on the application.

Figure 5B:
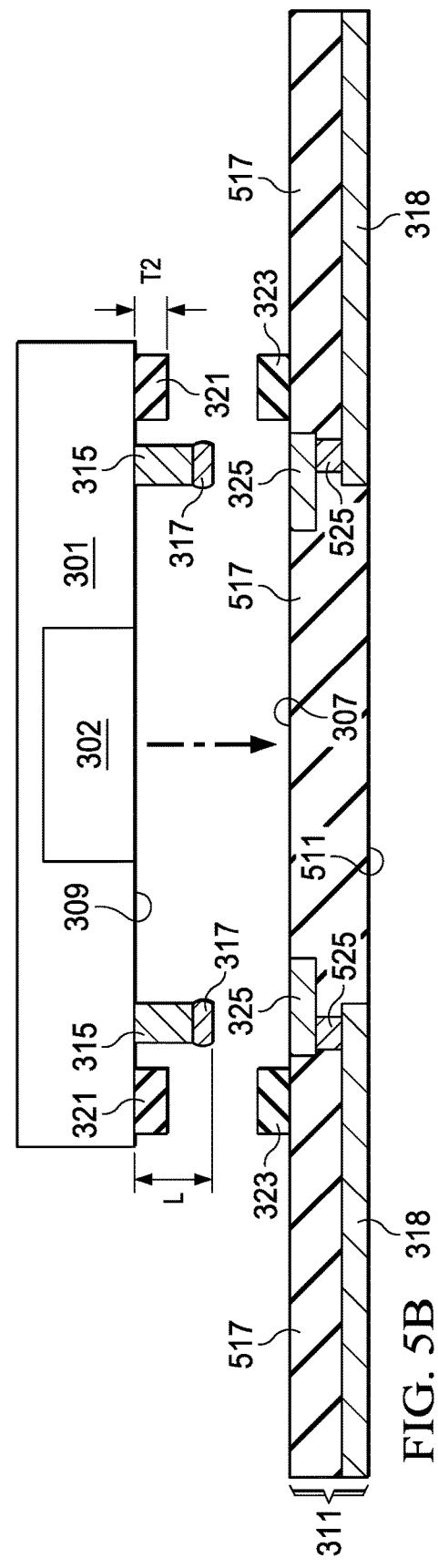

FIG. 5B illustrates the package substrate 311 from FIG. 5A in a further process step, where a semiconductor die 301 is placed in alignment with the package substrate 311 prior to assembly. Semiconductor die 301 has post connects 315 with solder balls 317 at the distal ends, and a die seal 321 of polyimide or another dielectric is formed on the device side surface 309 of the semiconductor die 301. In this example arrangement, the die seal 321 surrounds the conductive post connects 315. The die seal can have a thickness T2, in one example the thickness T2 can be about 0.035 millimeters. T2 can range from about 0.005 millimeters to 0.07 millimeters. The conductive post connects have a solder ball 317 at the distal ends, and the length of the conductive post connects L can be about 0.07 millimeters, in one example, and can range from 0.020-0.085 millimeters, or 20-85 microns. The semiconductor die 301 is shown arranged in alignment with the package substrate 311 prior to a flip chip die mounting step. Package substrate 311 has the die side surface 307, a board side surface 511, and terminals 318 formed as conductive traces on the board side surface. Vias 525 are filled conductive vias that couple the bond pads 325 on the die side surface 307 of the package substrate 311 to the terminals 318 on the board side surface 511.

Figure 5C:
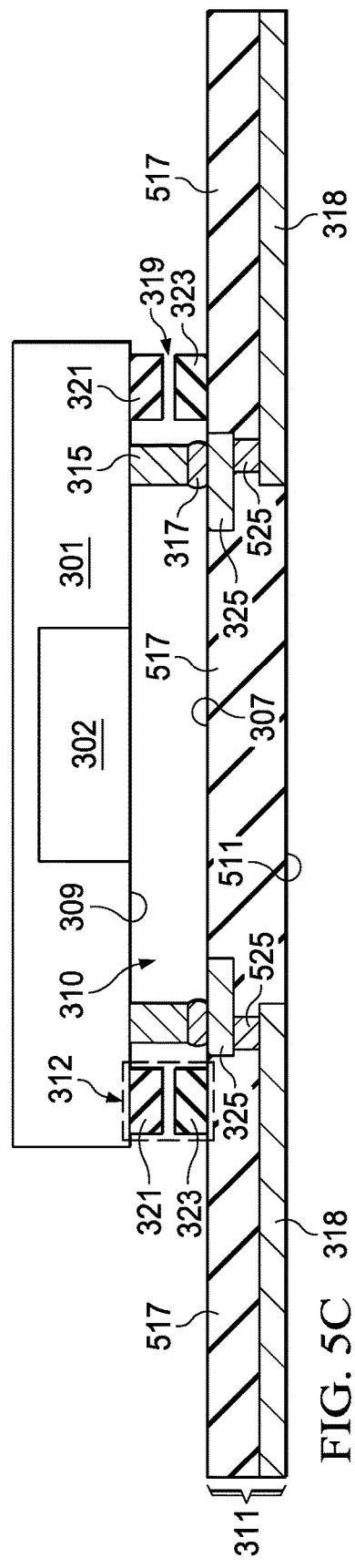

FIG. 5C illustrates the semiconductor die 301 mounted on the package substrate 311, in this example the routable lead frame. Die seal 321 meets package substrate seal 323 to form the mold compound seal 312. The die seal 321 and the package substrate seal 323 are not adhered together with adhesive but are placed in mechanical contact, and depending on manufacturing tolerances and the length of the conductive post connects 315, the die seal 321 and the package substrate seal 323 may be spaced by a slight gap 319 of less than about 25 microns, and in a range from 0 (no gap) to 25 microns. The maximum usable size of the gap 319 is determined by the size of a gap the mold compound selected can flow into, the gap 319 should be less than that size. Maximum gap sizes for 319 can range from 15-25 microns depending on the mold compound used. When the mold compound that will used to form the package body flows over the structure in an encapsulation step, mold compound seal 312 will prevent the mold compound from reaching the stress sensitive component 302. In some arrangements, a cavity 310 is formed with air inside, and the mold compound seal 312 prevents the mold compound 313 from flowing into cavity 310. Cavity 310 is bounded by the device side surface of semiconductor die 301, the die side surface of the package substrate 311, and the mold compound seal 312 which forms continuous vertical sides of the cavity 310.

FIG. 5D illustrates the package substrate 311 and the semiconductor die 301 of FIG. 5C, after additional processing. The package 300 (also shown in FIG. 3) is completed by an encapsulation step that is referred to as an overmolding process, mold compound 313 is used to encapsulate the semiconductor die 301 and the die side surface of the package substrate 311. During the molding process, mold compound 313 is used to cover the semiconductor die 301, and the mold compound is then cured. In an example process, a solid powder or pellet of thermoset epoxy resin mold compound is heated and brought to a liquid state, and then flowed under mechanical pressure into a mold to cover the elements. During the molding process, the mold compound seal 312 formed by the die seal 321 and the package substrate seal 323 keeps the mold compound 313 spaced from the stress sensitive component 302 on the semiconductor die 301. In the example arrangement of FIG. 5D, a cavity 310 is formed which contains air. The completed package 300 has a package width PW which, in one example, is about 3 millimeters, although package sizes can vary. The package height PH in the example is 0.9 millimeters, again the package height PH can also vary. The package substrate 311 in the example arrangement has a substrate height SH of about 0.2 millimeters, however various package heights can be used, and while a three layer package substrate is shown in the examples, more layers, or fewer layers, can be used, which can make the substrate height SH larger, or smaller, than 0.2 millimeters. The semiconductor die has a thickness that varies with semiconductor processes, and die thickness is sometimes reduced by a wafer backgrinding or wafer thinning operation in some processes. In an example the die thickness was about 0.27 millimeters, but can vary. The mold compound seal 312 in the example arrangement has a height H1 that is equal to the sum of the thicknesses T1 and T2, described above. In an example this height H1 is about 0.07 millimeters, and a gap 319 between the die seal 321 and the package substrate seal 323 can be from zero (when the die seal 321 and the package substrate seal 323 are in physical contact) to about 25 microns. The height H1 corresponds to the length of the conductive post connects 315 and the solder joints formed between the post connects 315 and the package substrate bond pads 325, example conductive post connects 315 have lengths from 20-85 microns, or 0.02-0.085 millimeters. The size of the gap 319 that can exist in the mold compound seal 312 and still form a useful arrangement can be determined by measuring a minimum space the mold compound selected can flow into. The size of particles used in the particular mold compound can be determined by experiment to determine the maximum gap 319 in mold compound seal 312 that can still prevent the mold compound 313 from entering the cavity 310. It is not necessary to adhere the die seal 321 to the package substrate seal 323 in the arrangements using adhesive, although adhesive could be used. Use of the arrangements spaces the stress sensitive component 302 from the mold compound 313, reducing or eliminating adverse impacts of mechanical stress on the stress sensitive component 302 which might otherwise occur. The ability to provide a mold compound seal 312 even when the die seal 321 and the package substrate seal 323 are spaced by a slight gap 319 makes use of the arrangements compatible with manufacturing tolerances and variations in the flip chip assembly processes, including variations in the height of solder joints formed between the conductive post connects 315 and the bond pads 325 on the package substrate 311.

Figure 5E:
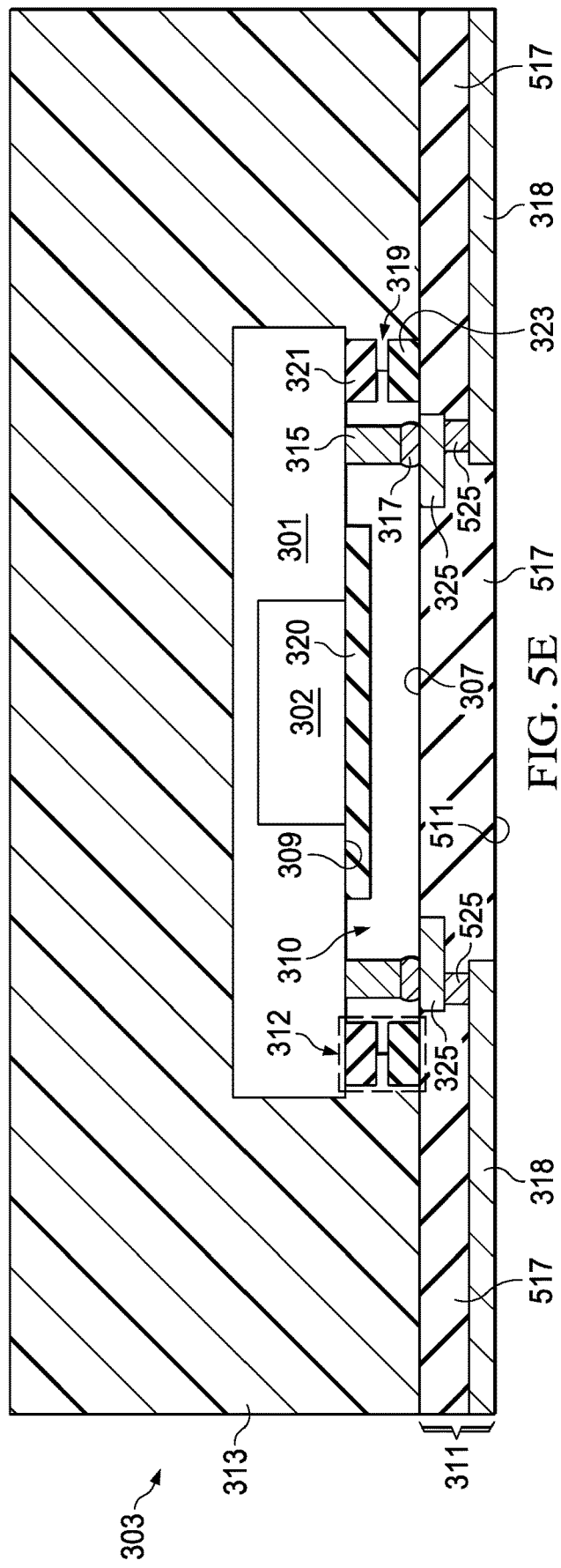
FIGS. 5E-5F illustrate in cross sectional views alternative arrangements.

FIG. 5E illustrates an alternative arrangement for a semiconductor device package 303 similar to the semiconductor device package 300 of FIG. 5D. In FIG. 5E, semiconductor die 301 is flip chip mounted to the package substrate 311, and a cavity 310 is bounded by mold compound seal 312, which surrounds the stress sensitive component 302, by the die side surface 307 of the package substrate 311, which is a routable lead frame, and by a polyimide layer 320 that is formed over the device side surface 309 of the semiconductor die 301 and covering the stress sensitive component 302. The post connects 315 extend from bond pads (not shown) on the device side surface of the semiconductor die 301 in areas exposed from the polyimide layer 320, and the die seal 321 is outside the area where the post connects 315 are formed and in the example shown, die seal 321 is also formed of polyimide material. The mold compound seal 312 includes the die seal 321 and the package substrate seal 323, which can be in contact with each other (no gap or a zero thickness gap) or spaced by a slight gap 319 as described above.

Figure 5F:
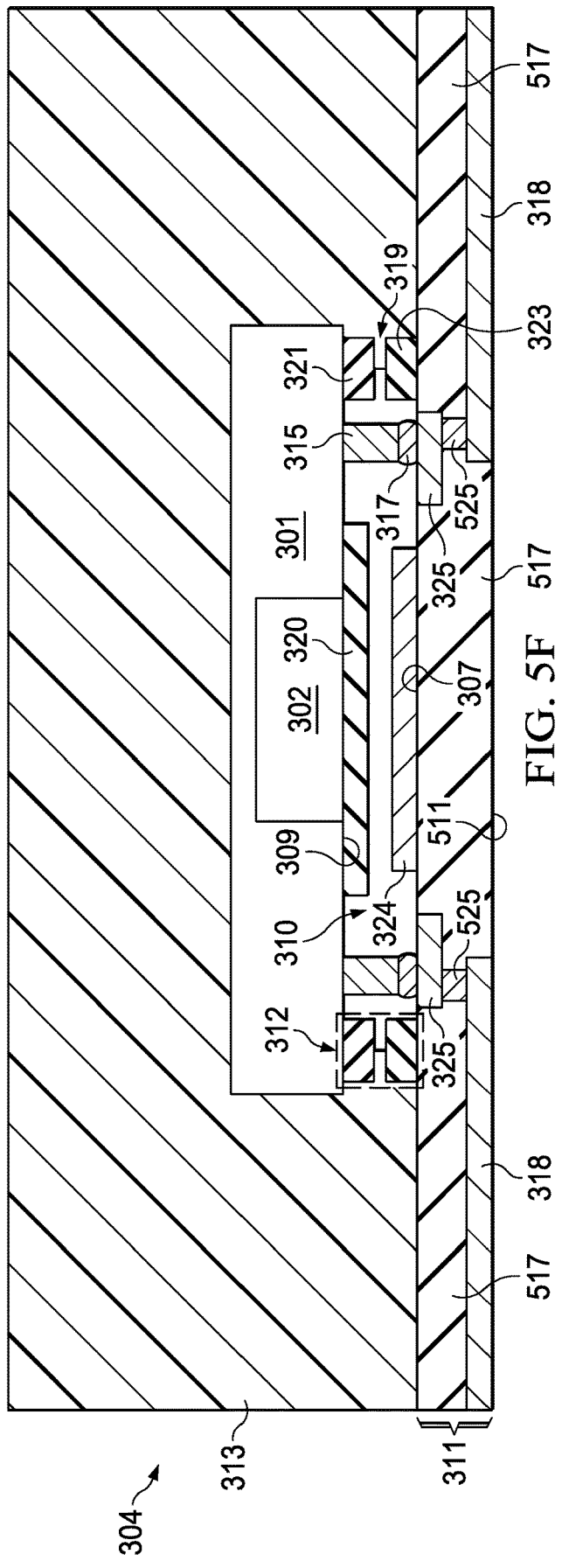

FIG. 5F illustrates, in another cross sectional view, an additional alternative arrangement for a packaged semiconductor device 304. In FIG. 5F, the semiconductor die 301 with a stress sensitive component 302 formed on the device side surface 309 is flip chip mounted to the package substrate 311 on a die side surface 309. Mold compound 313 is prevented from contacting the stress sensitive component 302 by mold compound seal 312. A cavity 310 can be formed by the mold compound seal 312, which surrounds post connects 315 and the stress sensitive component 302, and mold compound seal 312 includes the die seal 321, which is of polyimide formed on the device side surface 309 of the semiconductor die 301, and the package substrate seal 323, which is a conductor formed on the die side surface 307 of the package substrate 311. In the arrangement of FIG. 5F, polyimide 320 covers the die side surface of the semiconductor die 301 including the stress sensitive component 302, and conductor 324 covers a portion of the package substrate 311 corresponding to the area where the polyimide 320 is formed on the semiconductor die 301. When there is a slight gap 319 of less than 25 microns between the polyimide 320 and the conductor 324, which can be copper, gold, nickel, or another metal that is plated on the semiconductor substrate 311, the cavity 310 contains air, however in an example where there is no gap 319, and the polyimide 320 and the conductor 324 meet, then the cavity 310 is filled with these materials, and there is no air or less air. The length of the post connects 315 and the variation in the solder joints formed between the post connects 315 and bond pads 325 can determine whether there is a gap 319 between the materials or no gap.

Figure 6A:
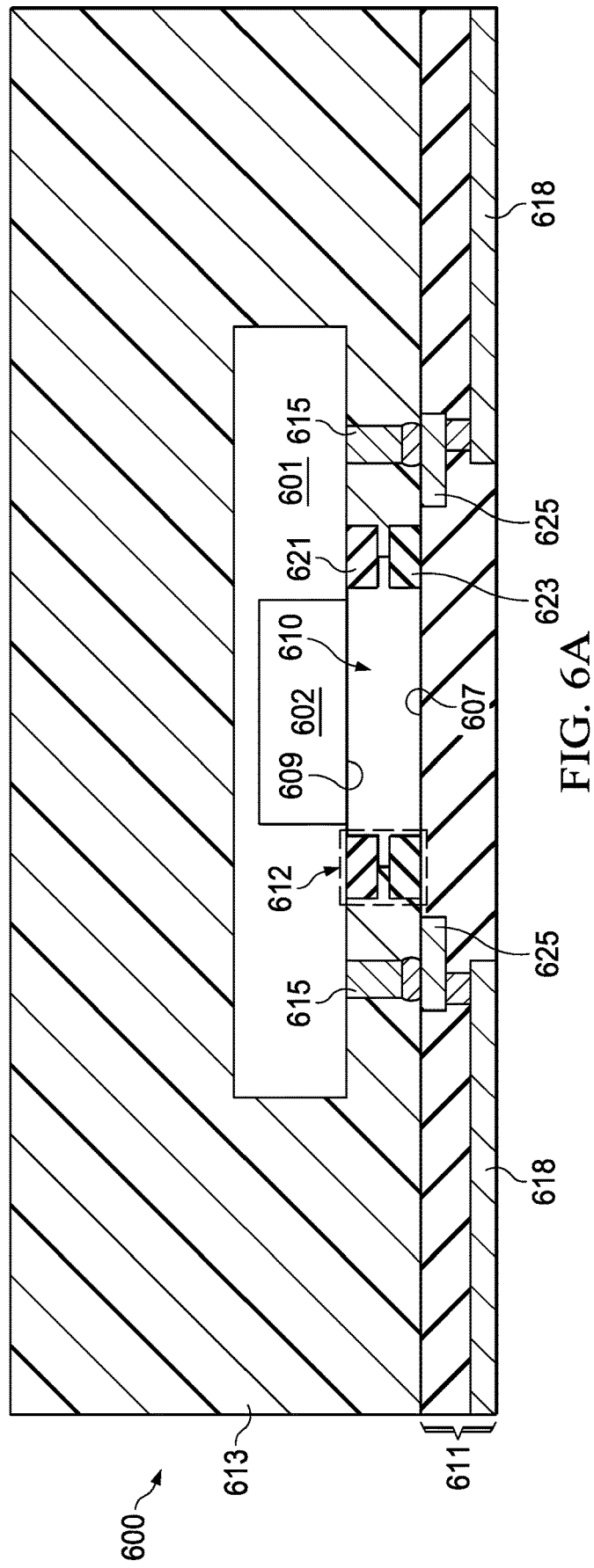
FIGS. 6A-6C illustrate in cross sectional views additional alternative arrangements.
Figure 6B:
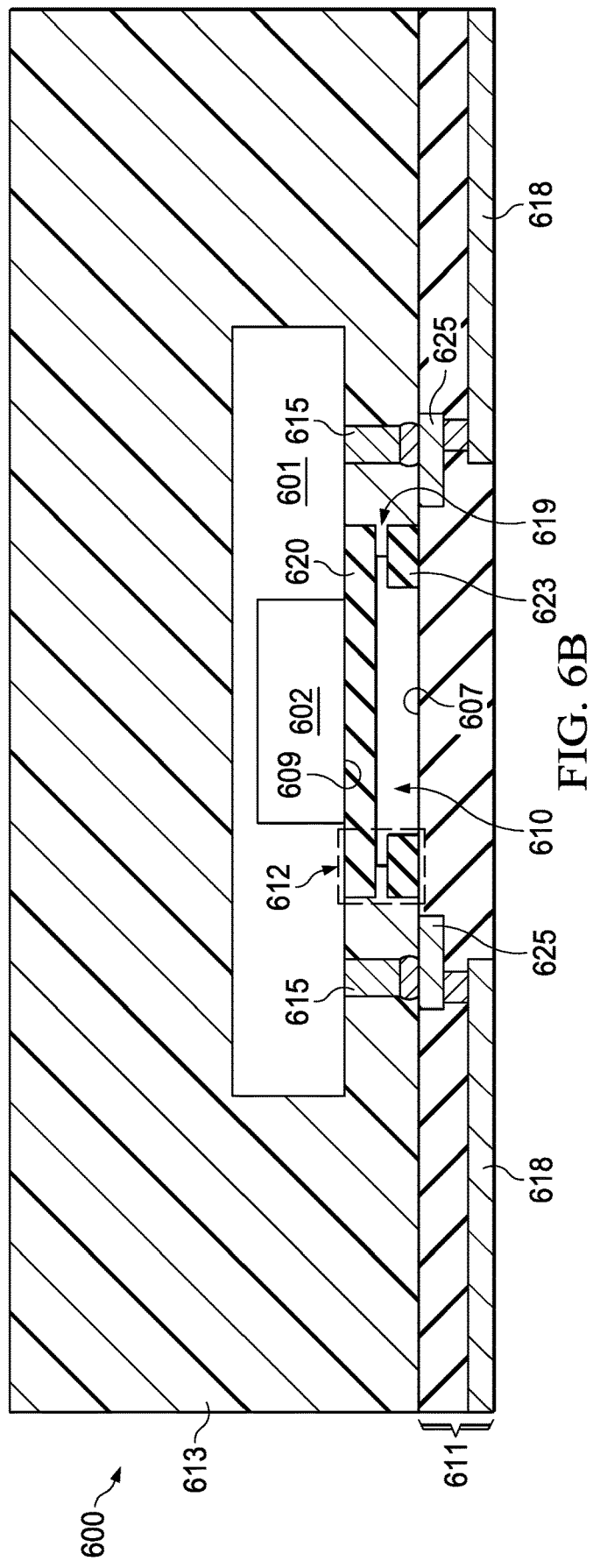
Figure 6C:
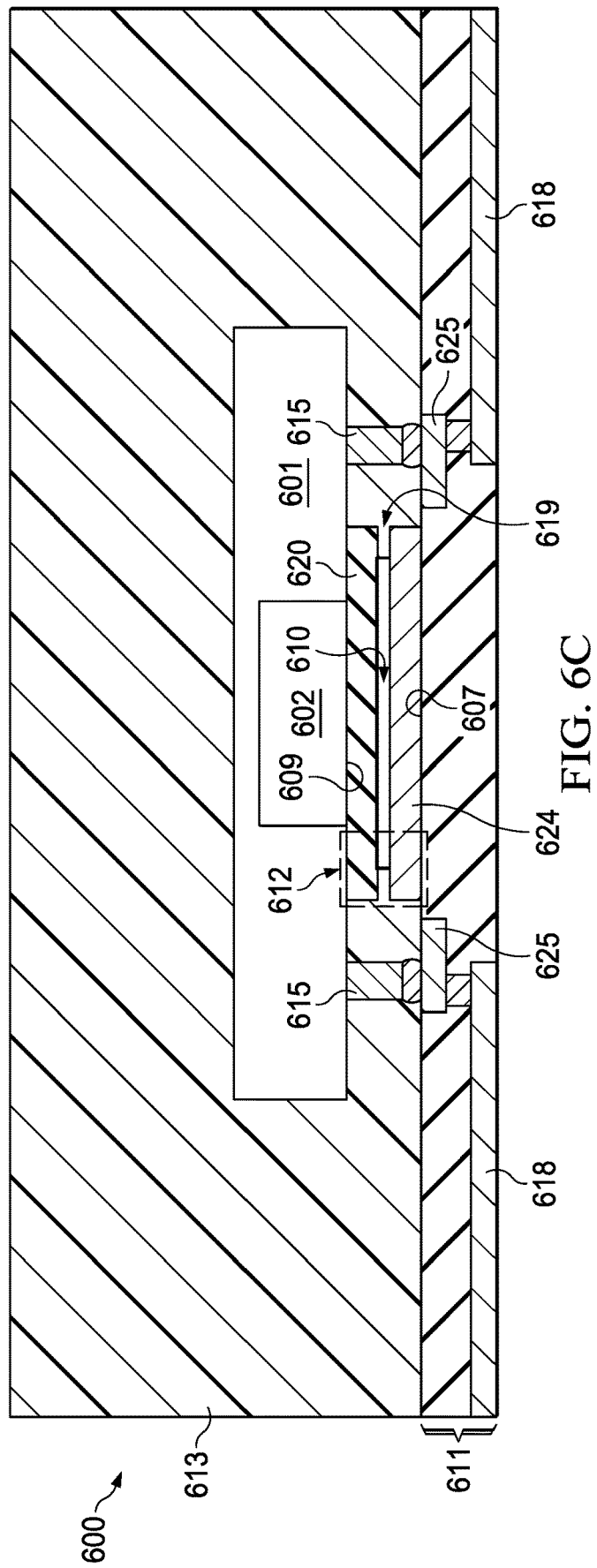

FIGS. 6A-6C illustrate, in additional cross sectional views, arrangements where the post connects in a flip chip mounted semiconductor die are outside an area surrounded by a mold compound seal. FIG. 6A illustrates, in a cross sectional view, another alternative arrangement for a semiconductor device package 600. A semiconductor die 601 has a stress sensitive component 602, such as a BAW device, on the device side surface 609. Package substrate 611, in this example a routable lead frame, has a die side surface 607, and semiconductor die 601 is flip chip mounted on the die side surface 607 using solder on the distal ends of conductive post connects 615 to form solder joints between the post connects 615 and bond pads 625 on the package substrate 611. A cavity 610 is formed by mold compound seal 612, which includes a die seal 621 of polyimide, and a package substrate seal 623 of a metal, such as copper, gold, nickel or alloys of these, that is formed on the die side surface 607 of the package substrate 611. The cavity 610 is bounded by the mold compound seal 612, the top surface formed by a portion of the device side surface 609 of the semiconductor die 601, and a bottom surface formed by a portion of the die side surface 607 of the package substrate 611. The cavity 610 surrounds the stress sensitive component 602, while the conductive post connects 615 are outside the mold compound seal 612 in this arrangement, which differs from the arrangement of FIG. 5D in that the post connects 615 are placed outside the mold compound seal 612, while in contrast the post connects 315 in the arrangement of FIG. 3 and FIG. 5D are within the mold compound seal 312. The mold compound 613 is in contact with the post connects 615 in the arrangement of FIG. 6A, but is spaced from the stress sensitive component 602 by the mold compound seal 612.

FIG. 6B illustrates, in another cross section, an alternative arrangement similar to the arrangement of FIG. 6A and incorporating features from the arrangement in FIG. 5E. In FIG. 6B, polyimide material 620 is formed over the portion of the device side surface 609 of the semiconductor die 601 that is within the mold compound seal 612, and the polyimide 620 also meets the package substrate seal 623 to form the mold compound seal 612. The polyimide 620 can be in contact with the package substrate seal 623 or can be spaced from the package substrate seal 623 by a gap 619 of less than 25 microns. There can be no gap (a gap with zero thickness) if the polyimide 620 makes physical contact with the package substrate seal 623. Package substrate seal 623 is formed on the die side surface 607 of the package substrate 611. During molding, the mold compound 613 is spaced from the stress sensitive component 602 due to the mold compound seal 612 surrounding the stress sensitive component 602, the polyimide 620, and the die side surface of the package substrate 611, which form the bounds of the cavity 610.

FIG. 6C is another alternative arrangement where the post connects 615 are formed outside a mold compound seal in a flip chip semiconductor package, and the arrangement in FIG. 6C incorporates some features of the arrangement in FIG. 5F. In FIG. 6C, the features are very similar to the arrangement in FIG. 6B, with the exception that the package substrate seal (623 in FIG. 6B) is now modified to be a conductor 624 that is extended over the portion of the die side surface 607 of the package substrate 611 in a pattern that corresponds to polyimide 620 on the device side surface of the semiconductor die 601. The polyimide 620 and the conductor 624 may meet or, as shown in the example of FIG. 6C, may be spaced apart by a slight gap 619, this gap will be less than 25 microns. There can be no gap if the materials in polyimide 620 and conductor 624 meet. During the molding process, when mold compound 613 is formed over the semiconductor die 601 and package substrate 611, the mold compound 613 is prevented from coming into contact with the stress sensitive component 602 by the mold compound seal 612 formed by polyimide 620 on the device side surface of the semiconductor die 601 and conductor 624 that is formed on the die side surface of the package substrate 611. The mold compound seal 612 may surround a cavity containing air when there is a slight gap of less than 25 microns, however in an example where the polyimide 620 and the conductor 624 meet, and there is no gap between them, then cavity 610 is filled by the two materials 620, 624.

Figure 7A:
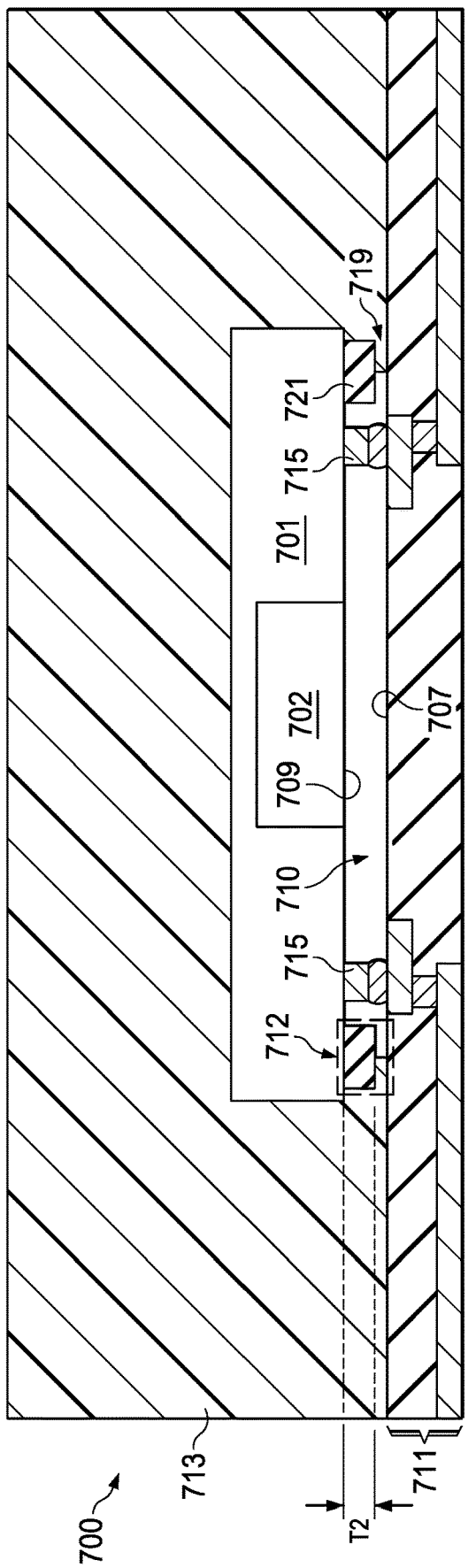
FIGS. 7A-7B illustrate in cross sectional views further alternative arrangements.
Figure 7B:
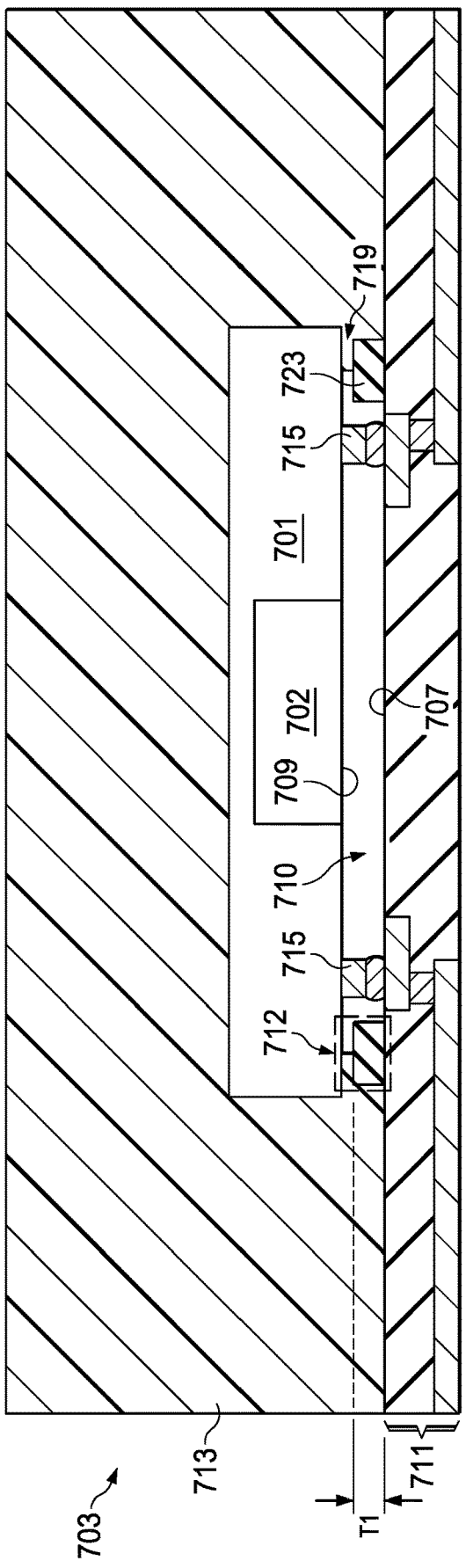

FIGS. 7A-7B illustrate, in two further arrangements, a packaged semiconductor device when the post connects have a shorter length, for example of 0.020-0.035 millimeters, or 20-35 microns. In FIG. 7A, a semiconductor device package 700 includes a semiconductor die 701 with a stress sensitive component 702 formed on the device side surface 709. The package substrate 711 is similar to the package substrate of FIG. 3, for example, and is again a routable lead frame. In this arrangement, the post connects 715 are shorter than those used in the arrangements described above. The thickness of the die seal 721, T2, can be sufficient to provide the mold compound seal 312 without the use of the package substrate seal material, so that the die side surface 707 of the package substrate 711 does not have a package substrate seal. For example, the thickness T2 of the die seal, which can be of polyimide or BCB, can be from 0.01-0.35 millimeters, and can be of similar thickness to the length of the post connects 715, for example 0.02 millimeters. When the semiconductor die 701 is flip chip mounted to the die side surface 707 of the package substrate 711, the mold compound seal 712 is formed by the die seal 721 meeting the surface of the package substrate 711, and a cavity 710 is formed by the mold compound seal 712, surrounding the stress sensitive component on all sides, and by the device side surface 709 of the semiconductor die 701, forming a top surface of the cavity 710, and by the die side surface 707 of the package substrate 711, forming a bottom surface of the cavity 710. The mold compound seal 712 again prevents mold compound 713 from contacting the stress sensitive component 702. A slight gap 719 of less than a maximum gap thickness of 15-25 microns can be formed between the die seal 721 and the die side surface 707 of the package substrate 711, or the gap can be zero when the die seal 721 meets the die side surface 707.

FIG. 7B illustrates, in another cross sectional view, an alternative arrangement for a semiconductor device package 703. In FIG. 7B, the die seal (see 721 in FIG. 7A) is not present, instead a package substrate seal 723 is used. The mold compound seal 712 in FIG. 7B is formed by the device side surface 709 of the semiconductor die 701 meeting the package substrate seal 723. A gap 719 of less than 15-25 microns, depending on the mold compound 713 that is used, can be formed between the package substrate seal 723 and the device side surface of the semiconductor die 701 and forms a useful mold compound seal 712. The gap 719 may not be present (a gap of zero thickness) when the package substrate seal 723 is in physical contact with the device side surface of the semiconductor die 701. The thickness T1 of the package substrate seal 723 corresponds to the length of the post connects 715, which can be, for example between 0.02-0.035 millimeters in the arrangement of FIG. 7B.

Figure 8:
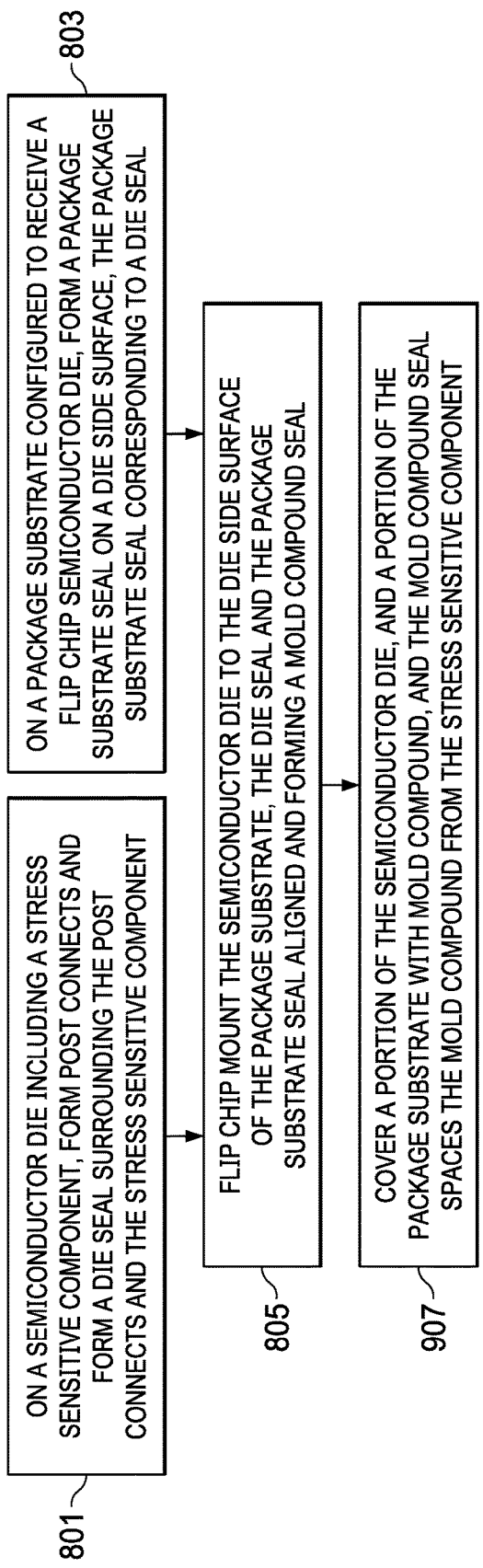
FIG. 8 illustrates in a flow diagrams a series of steps for forming example arrangements.

FIG. 8 illustrates, in a flow diagram, a method for forming an arrangement. Certain steps of FIG. 8 can be done independently from one another, and at different times, as described below. The order of steps can be varied. At step 801, on a semiconductor die including a stress sensitive component, post connects and a die seal surround the post connects and the stress sensitive component are formed (see, for example, FIG. 4A.) At step 803, on a package substrate that is configured to receive a flip chip semiconductor die, a package substrate seal is formed on the die side surface that corresponds to the die seal (see, for example, FIG. 4B). Steps 801 and 803 are independent from one another, and can be performed at different times, in any order, and at different places, so long as the die seal of step 801 and the package substrate seal in step 803 correspond to one another.

The method continues at step 805, where the semiconductor die is flip chip mounted to the die side surface of the package substrate, and the die seal and the package seal form a mold compound seal (see FIG. 4C, and FIG. 5C). Note that the die seal and the package substrate seal can meet, or alternatively, be spaced by a slight gap, as shown in FIG. 5C.

At step 807, a portion of the semiconductor die, and a portion of the package substrate are covered with mold compound, and the mold compound seal spaces the mold compound from the stress sensitive component on the semiconductor die. During the encapsulation process, the mold compound is prevented from contacting the stress sensitive component by the mold compound seal (see FIG. 3 and FIG. 5D).

In example arrangements, a mold compound seal is formed by a combination of a die seal, a dielectric formed on the device side surface of a semiconductor die, and a package substrate seal, a conductor formed on the die side surface of a package substrate in correspondence with the die seal. The mold compound seal is a hybrid seal that is formed from two different materials. The mold compound seal can be formed by placing the die seal and the package substrate deal in physical contact with no gap between them, alternatively a slight gap can be between the die seal and the package substrate seal. Because the mold compound seal is effective to keep mold compound from contacting a stress sensitive component on the semiconductor die even if a slight gap exists, the arrangements are compatible with flip chip packages using solder joints formed between conductive post connects and the semiconductor substrate, even when the height of the conductive post connects and the solder joints vary between post connects. In additional example arrangements, a mold compound seal can be formed between a flip chip mounted semiconductor die and a package substrate by a die seal, a dielectric material on the semiconductor die, or by a package substrate seal, a conductor material on the package substrate. The arrangements are economical and effective in reducing mechanical stress on stress sensitive components due to mold compound stress.

Modifications are possible in the described arrangements, and other alternative arrangements are possible within the scope of the claims.

What is claimed is:

1. An apparatus, comprising:
a semiconductor die with a component on a device side surface;
post connects extending from the device side surface of the semiconductor die;
a die seal surrounding the component on the device side surface of the semiconductor die;
a package substrate having bond pads on a die side surface and having a board side surface opposite the die side surface;
a package substrate seal formed on the die side surface of the package substrate corresponding to the die seal on the semiconductor die;
the semiconductor die flip chip mounted on the bond pads of the package substrate, with solder joints connecting the post connects of the semiconductor die to the bond pads of the package substrate;
a mold compound seal formed by the die seal and the package substrate seal; and
a mold compound covering a portion of the semiconductor die and a portion of the die side surface of the package substrate, and contacting the mold compound seal, the mold compound spaced from the component.

2. The apparatus of claim 1, wherein the die seal comprises a continuous piece of dielectric material formed on the device side surface of the semiconductor die.

3. The apparatus of claim 2, wherein the dielectric material comprises polyimide.

4. The apparatus of claim 2, wherein the dielectric material comprises benzocyclobutene (BCB).

5. The apparatus of claim 1, wherein the package substrate seal comprises a continuous piece of plated conductor.

6. The apparatus of claim 5, wherein the plated conductor comprises one of copper, gold, nickel, or alloys thereof.

7. The apparatus of claim 1, wherein the package substrate is a lead frame having conductors spaced by dielectric material for routing.

8. The apparatus of claim 1, wherein the package substrate seal is plated on the die side surface of the package substrate and has a first thickness.

9. The apparatus of claim 1, wherein the mold compound seal includes a gap between the die seal and the package substrate seal that is less than 15 microns.

10. The apparatus of claim 1, wherein the mold compound seal includes a gap between the die seal and the package substrate seal that is less than 25 microns.

11. The apparatus of claim 1, wherein the mold compound seal comprises the die seal and the package substrate seal in physical contact with no gap between them.

12. The apparatus of claim 1, wherein the post connects are surrounded by the die seal on the device side surface of the semiconductor die.

13. The apparatus of claim 1, wherein the post connects are outside an area surrounded by the die seal on the device side surface of the semiconductor die.

14. The apparatus of claim 1, wherein the mold compound seal, the device side surface of the semiconductor die, and the die side surface of the package substrate form bounds of a cavity containing air, and the component is within the cavity.

15. The apparatus of claim 1, wherein the component is a bulk acoustic wave (BAW) device.

16. An apparatus, comprising:
a package substrate having bond pads configured for flip chip mounting a semiconductor die on a die side surface of the package substrate, and having an opposing board side surface;

a semiconductor die having a component on a device side surface, and having post connects extending from the device side surface, the post connects mounted to the die side surface of the package substrate, the post connects joined to the bond pads on the package substrate by solder joints;

a mold compound seal formed between the device side surface of the semiconductor die and the die side surface of the package substrate; and a mold compound covering a portion of the semiconductor die and a portion of the die side surface of the package substrate, and in contact with the mold compound seal, the component spaced from the mold compound.

17. The apparatus of claim 16, wherein the mold compound seal further comprises: at least one of:

a package substrate seal formed on the die side surface of the package substrate, the package substrate seal formed of a continuous piece of conductor material plated on the die side surface of the package substrate and having a first thickness; and a die seal formed on the device side surface of the semiconductor die, the die seal formed of a continuous piece of dielectric material with a second thickness.

18. The apparatus of claim 17, wherein the mold compound seal comprises the die seal and the mold compound seal has a height equal to the second thickness.

19. The apparatus of claim 17, wherein the mold compound seal comprises the package substrate seal and the mold compound seal has a height equal to the first thickness.

20. The apparatus of claim 17, wherein the mold compound seal comprises the die seal and the package substrate seal, and the mold compound seal has a height that is equal to a sum of the first thickness and the second thickness.

21. The apparatus of claim 17, wherein the mold compound seal comprises the die seal and the package substrate seal spaced by a gap that is less than 25 microns.

22. The apparatus of claim 17, wherein the mold compound seal comprises the die seal and the package substrate seal in physical contact with each other.

23. The apparatus of claim 17, wherein the mold compound seal, the device side surface of the semiconductor die, and the die side surface of the package substrate bound a cavity, and the cavity contains air.

* * * * *